(12) United States Patent
Louwsma et al.

(10) Patent No.: US 8,035,539 B2
(45) Date of Patent: Oct. 11, 2011

(54) SIGNAL SAMPLING CIRCUIT

(75) Inventors: Simon Minze Louwsma, Enschede (NL); Maarten Vertregt, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/677,010

(22) PCT Filed: Sep. 12, 2008

(86) PCT No.: PCT/IB2008/053682
§ 371 (c)(1),
(2), (4) Date: Mar. 8, 2010

(87) PCT Pub. No.: WO2009/034543
PCT Pub. Date: Mar. 19, 2009

(65) Prior Publication Data
US 2010/0207792 A1    Aug. 19, 2010

(30) Foreign Application Priority Data
Sep. 13, 2007   (EP) ........................................ 0717840

(51) Int. Cl.
*H03M 1/00* (2006.01)
(52) U.S. Cl. ........................................ 341/122; 341/155
(58) Field of Classification Search ................ 341/155, 341/122; 327/390, 93, 97, 589, 288
See application file for complete search history.

(56) References Cited

U.S. PATENT DOCUMENTS

| | | | | |
|---|---|---|---|---|
| 5,170,075 A * | 12/1992 | de Wit | ............................ | 327/93 |
| 6,323,697 B1 * | 11/2001 | Pavan | ............................ | 327/94 |
| 6,384,758 B1 | 5/2002 | Michalski et al. | | |
| 6,489,758 B2 * | 12/2002 | Moriconi et al. | ............ | 323/288 |
| 6,724,236 B1 * | 4/2004 | Sarraj | ........................... | 327/390 |
| 6,977,544 B2 * | 12/2005 | Nicollini et al. | ............... | 327/589 |
| 7,136,000 B1 | 11/2006 | Hidri et al. | | |
| 2002/0105339 A1 | 8/2002 | Nagaraj | | |
| 2005/0035791 A1 | 2/2005 | Devendorf et al. | | |
| 2005/0046605 A1 | 3/2005 | Ayyagari et al. | | |
| 2005/0270210 A1 | 12/2005 | Arsian | | |
| 2006/0224365 A1 * | 10/2006 | Pickerd et al. | ................ | 702/190 |
| 2007/0035335 A1 | 2/2007 | Lee | | |

FOREIGN PATENT DOCUMENTS

| | | |
|---|---|---|
| WO | 99/34517 A1 | 7/1999 |
| WO | 02/071616 A2 | 9/2002 |

OTHER PUBLICATIONS

Louwsma, S. M., et al; "A 1.6 GS/s, 16 Times Interleaved Track & Hold With 7.6 ENOB in 0.12/spl mu/m CMOS (ADC Application)"; Solid-State Circuits Conference ESSCIRC 2004; IEEE Piscataway, NJ, US; Sep. 2004; 4 Pages.

* cited by examiner

*Primary Examiner* — Jean Jeanglaude

(57) ABSTRACT

A sampling circuit includes multiple sampling channels adapted to sample the signal in time-multiplexed fashion. Each sampling channel includes a respective track-and-hold circuit connected to a respective analogue to digital converter via a respective output switch. The output switch of each channel opens for a tracking time period when the track-and-hold circuit is in a tracking mode for sampling the signal, and closes for a holding time period when the track-and-hold circuit is in a holding mode for outputting the sampled signal. In an embodiment, the holding time period includes a settling time period that is at least as long as the tracking time period. The settling time period is used by the track-and-hold circuit to charge an input capacitance of the analogue to digital converter to a voltage according to the sampled signal.

17 Claims, 11 Drawing Sheets

Gain = 16 = $2^4$ → shift bits 4 pos.:
```
ADC1:    6  5  4  3  2  1
ADC2:                6  5  4  3  2  1
                                      +
Total:  10  9  8  7  6  5  4  3  2  1
```
FIG. 15
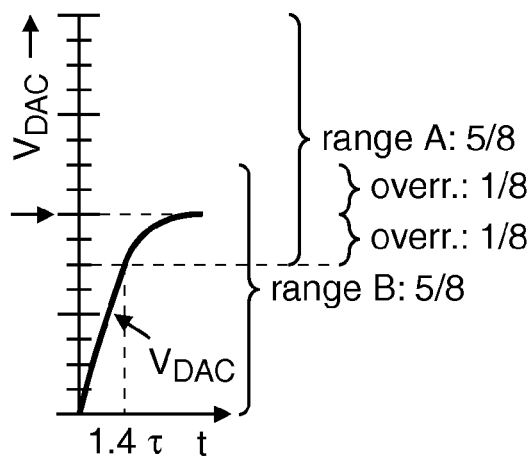
FIG. 16
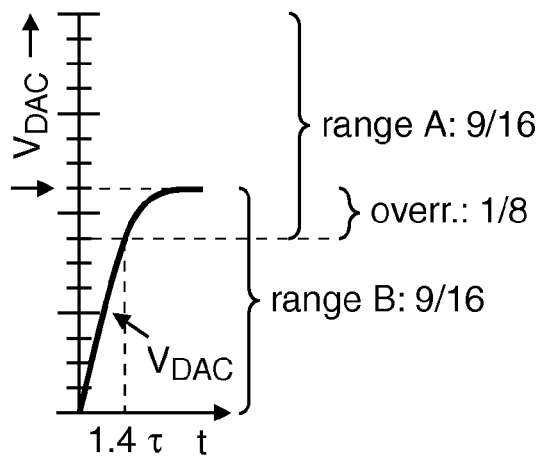
FIG. 17

SIGNAL SAMPLING CIRCUIT

This invention relates to a high-speed sampling circuit for sampling a signal.

A known track-and-hold circuit is shown in FIG. 1. This known track-and-hold circuit comprises a sampling transistor TR1 that is connected between an input voltage signal $V1_{IN}$ and a sampling capacitor $C1_S$. The sampling capacitor $C1_S$ is also connected to the input of a buffer circuit BUF1, and the output of the buffer circuit BUF1 drives a capacitive load $C1_{ADC}$ of the input of an Analogue to Digital Converter (ADC).

In use, the sampling transistor TR1 is turned on to connect the input voltage signal $V1_{IN}$ to the sampling capacitor $C1_S$ and to the input of the buffer circuit BUF1. Hence, the voltage on the sampling capacitor $C1_S$ and on the input to the buffer circuit BUF1 tracks the voltage of the input signal $V1_{IN}$. Then, when the voltage of the input signal is to be sampled, the sampling transistor TR1 is turned off, and the voltage $V1_{T/H}$ of the input signal is stored on the sampling capacitor $C1_S$. The buffer BUF1 buffers the voltage stored on the sampling capacitor $C1_S$ to the output capacitive load $C1_{ADC}$. The higher the input voltage signal frequency, the higher the bandwidth of the buffer circuit must be, and the more power is required for the buffer.

One technique for sampling high-frequency signals, shown in FIG. 2, is to interleave many (for example 16) of the circuits of FIG. 1 together in a time-multiplexed fashion, each thereby providing a respective time-multiplexed sampling channel comprising a respective track-and-hold circuit (T/H) connected to a respective analogue to digital converter (ADC) so that the bandwidth of the buffer circuits can be reduced by a factor of 16 to save power.

However, in practice as shown in FIG. 3 (in which reference numeral 2 indicates the error due to charge-redistribution), if the bandwidth of the buffer circuits is reduced by a factor of 16, then the output $V1_{BUF}$ of each buffer circuit tracks the input signal $V1_{T/H}$ with significant phase shift and attenuation. This can lead to distortion after the sampling transistor TR1 is turned off at time $T1_S$, due to charge redistribution though the non-linear parasitic capacitance between the input and output of each buffer circuit and its sampling capacitor.

One solution is to scale the size of each buffer circuit back up again to improve the bandwidth, although, this leads to increased power consumption and increased input capacitance. An increased input capacitance limits the bandwidth of the sampling transistor TR1 and sampling capacitor $C1_S$ combination, and can lead to distortion of the high-frequency input signal, making this approach unfeasible for a high-linearity circuit.

US 2002/0105339 discloses a sampling circuit in which four sample and hold sub-circuits are coupled together in parallel in a time-interleaved fashion with each sample and hold sub-circuit being provided with a respective switch provided for the purpose of combining the respective outputs at a common output point prior to being input jointly into a single analogue to digital converter. Thus the conversion time will be four times longer than if there were four separate channels each comprising a respective track-and-hold circuit connected in series to a respective analogue to digital converter.

It is, therefore, an object of the invention to improve on the known art.

According to a first aspect of the invention, there is provided a sampling circuit for sampling a signal, the sampling circuit comprising a plurality of sampling channels adapted to sample the signal in time-multiplexed fashion, each sampling channel comprising a respective track-and-hold circuit connected to a respective analogue to digital converter via a respective output switch; the output switch of each channel adapted to:

open for a tracking time period when the track-and-hold circuit of the sampling channel is in a tracking mode for sampling the signal;

close for a holding time period when the track-and-hold circuit of the sampling channel is in a holding mode for outputting the sampled signal.

Each track and hold circuit tracks the input signal for a tracking time period in order to sample the input signal, and then holds the sampled signal for a holding time period.

In a further aspect, the present invention provides a method of sampling a signal, the method comprising: using a sampling circuit for sampling a signal, the sampling circuit comprising a plurality of sampling channels adapted to sample the signal in time-multiplexed fashion, each sampling channel comprising a respective track-and-hold circuit connected to a respective analogue to digital converter via a respective output switch; and, for each channel:

opening the output switch for a tracking time period when the track-and-hold circuit of the sampling channel is in a tracking mode for sampling the signal; and closing the output switch for a holding time period when the track-and-hold circuit of the sampling channel is in a holding mode for outputting the sampled signal.

The use of an output switch in each sampling channel circuit, and the use of time-multiplexing, means that the power consumption of channel, in particular each track-and-hold circuit of each channel, can be significantly reduced. This is because the track-and-hold circuit is disconnected from the its respective ADC input during the tracking time, meaning that the output drive capability of the track-and-hold circuit can be significantly reduced, thereby reducing the power consumption. Ordinarily, this reduction in the output drive capability, would result in the track-and-hold circuit being unable to drive the respective ADC input to the required voltage before a further input signal sample was to be taken in a subsequent tracking time period. However, by time-multiplexing a plurality of these channels including track-and-hold circuits together, the time period allowed for each track-and-hold circuit to drive its ADC input to the required voltage is lengthened, thereby enabling the reduction in the drive capability of the track-and-hold circuits, that can be obtained using the output switches, to be realised. Thus the present invention provides that by virtue of the respective output switch between the buffer output and the respective ADC, the buffer output can follow the buffer input during the tracking time and therefore charge-redistribution through the buffer does not occur after tracking time. By virtue of the interleaved ADC as well as the interleaved track and hold circuit, the reduced size buffer has enough time to drive the ADC to the required value. This is in contrast to prior art arrangements, in which the bandwidth of the buffer cannot be reduced to reduce power consumption, because in prior art arrangements the buffer output would not follow the buffer input closely enough during tracking time, and so non-linear charge redistribution through the buffer would result at the end of the tracking time, thereby distorting the input to the ADC. Furthermore, the buffer output would not drive an ADC to the final value quickly enough.

The time period required for the track-and-hold circuit to drive its ADC input to a voltage according to the sampled signal, is hereinafter referred to as the settling time period. In all the above aspects, the time allowed for the settling time period may be at least as long as the time allowed for the tracking time period.

In all the above aspects, advantageously, each track-and-hold circuit may comprise:
- a sampling switch having an input for receiving the signal;
- a sampling capacitor that is connected to the output of the sampling switch;
- a buffer having an input that is connected to the output of the sampling switch, and an output that is connected to the output switch; and
- a control circuit, adapted to:
  - close the sampling switch and open the output switch for the tracking time period;
  - open the sampling switch and close the output switch for the holding time period.

Therefore, the control circuits may sequentially set each track-and-hold circuit into a tracking mode for a tracking time period, to implement the time-multiplexing. The control circuit of a track-and-hold circuit can close the sampling switch and open the output switch for the tracking time period, so that the output of the buffer can track an input voltage signal that is applied to the input of the sampling switch. Then, the control circuit can open the sampling switch and close the output switch for a holding time period. Since the buffer output closely tracks the buffer input, there is minimal charge redistribution through the non-linear capacitance between the input and output of the buffer when the sampling switch is opened, and so the voltage at the buffer input on the sampling capacitor very closely matches the voltage of the input signal that was present at the instant when the sampling switch was opened. The buffer drives the capacitive load of the respective ADC input to reflect the voltage stored on the sampling capacitor during a settling time period of the holding time period, the settling time period preferably being at least as long as the holding time period.

In all the above aspects, the signal that is sampled by the track-and-hold circuits may be a time-continuous signal, or it may be a discontinuous signal, for example a signal output from an additional signal sampling switch.

In all the above aspects, the output switches may, for example, be implemented using transistor switches, switched impedances (resistive, capacitive), micro-electro-mechanical switches (MEMS), or by using a fixed impedance in combination with any of the above.

In all the above aspects, the sampling switch may be bootstrapped. This advantageously tends to make the on-resistance of the sample-switch more constant over varying $V_{IN}$ and tends to avoid signal dependent charge injection, tending to result in better linearity. Also, the turn-off time tends to be less dependent on the momentary voltage of the input signal.

In all the above aspects, the buffer may be a unity gain buffer, which may be a p-type source-follower with an additional n-type source-follower. This advantageously tends to keep the drain-source voltage of a PMOS transistor constant.

In all the above aspects, the channel offset of each channel may be adjustable. This avoids a conflict that would arise between reducing channel offsets by device sizing and speed and power constraints.

In all the above aspects, each analogue to digital converter may comprise two Successive Approximation analogue to digital converters combined in a pipeline configuration. Advantageously this tends to obtain, or contribute to obtaining, a high sample-rate and good power efficiency.

In all the above aspects, each analogue to digital converter may be adapted to employ a single-sided overrange technique. Advantageously this tends to obtain, or contribute to obtaining, a high sample-rate and good power efficiency.

In all the above aspects, each analogue to digital converter may be adapted to employ look-ahead logic. Advantageously this tends to obtain, or contribute to obtaining, a high sample-rate and good power efficiency.

In all the above aspects, the number of sampling channels may be 16. This advantageously allows the load to be driven by a source of desirable resistance, for example 50Ω, and also allows to not require a buffer.

In all the above aspects, the sampling circuit may comprise a master clock. This advantageously provides that the actual sample moment only depends on the one common clock, thereby tending to minimize timing offsets.

In all the above aspects, the sampling circuit may comprise matched lines adapted to distribute clock and input signals to the channels, thereby advantageously tending to minimize timing offsets.

Embodiments of the present invention will now be described, by way of example, with reference to the accompanying drawings, in which.

Figure 5:
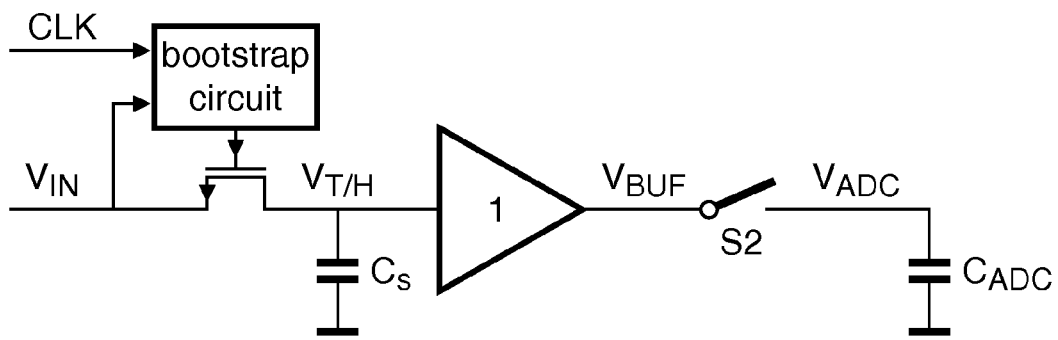
Figure 6:
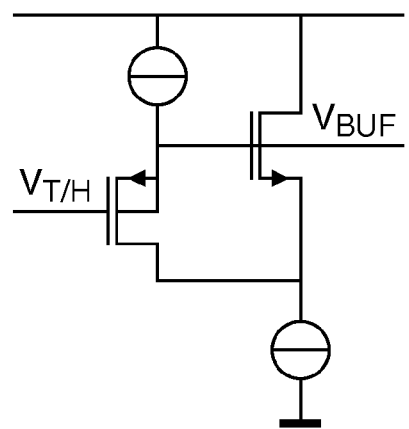
Figure 7:
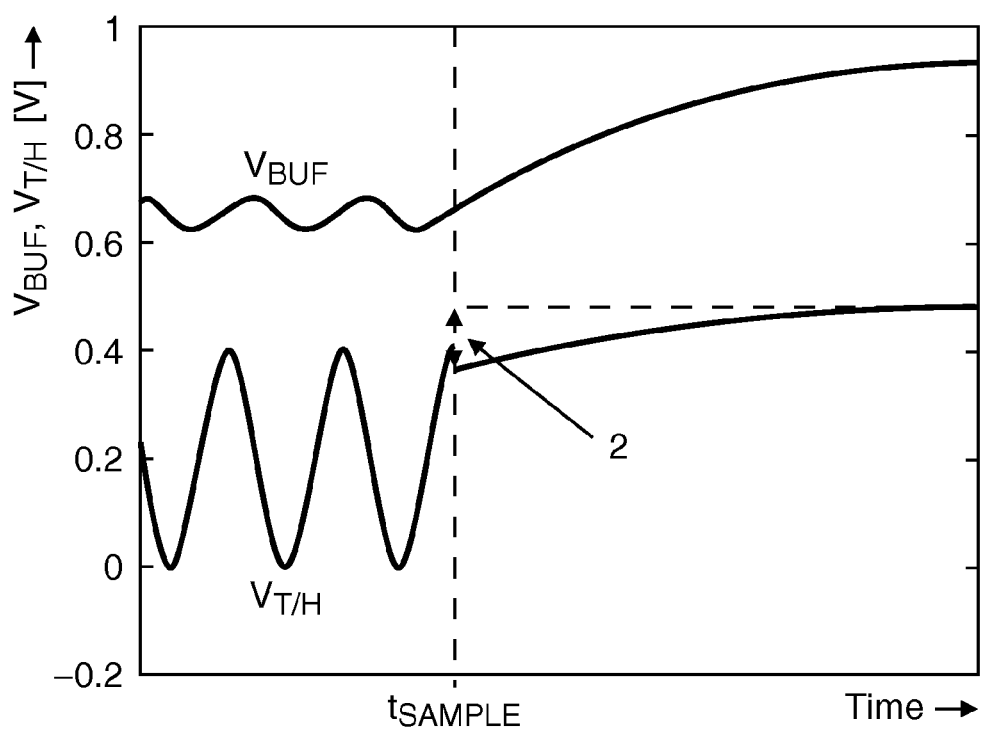
Figure 8:
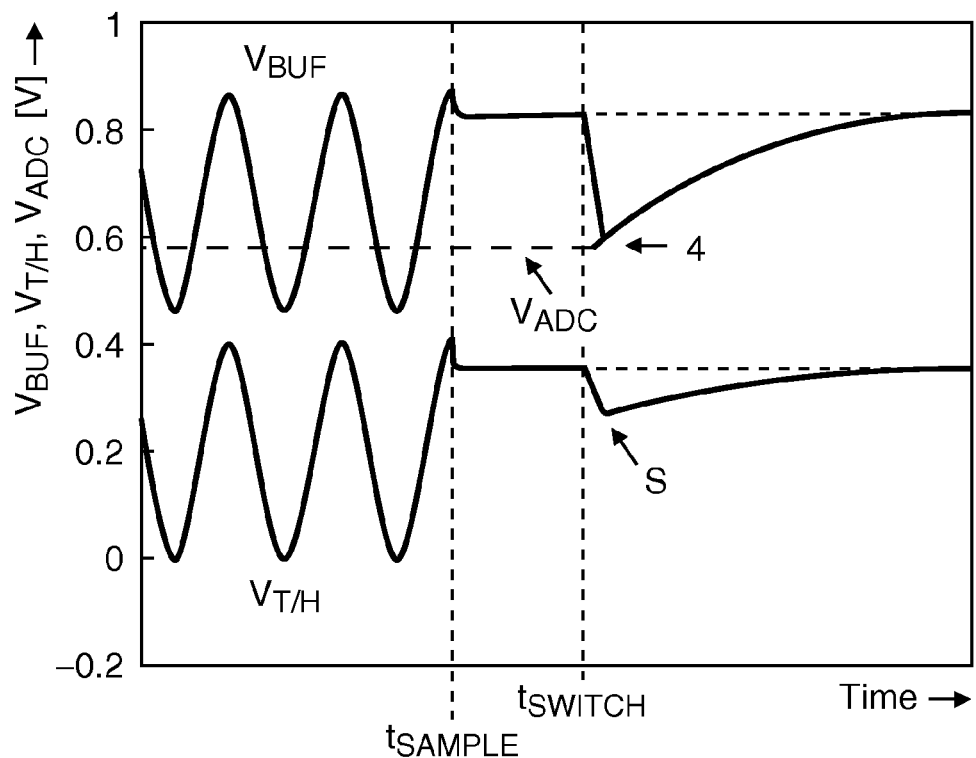
Figure 9:
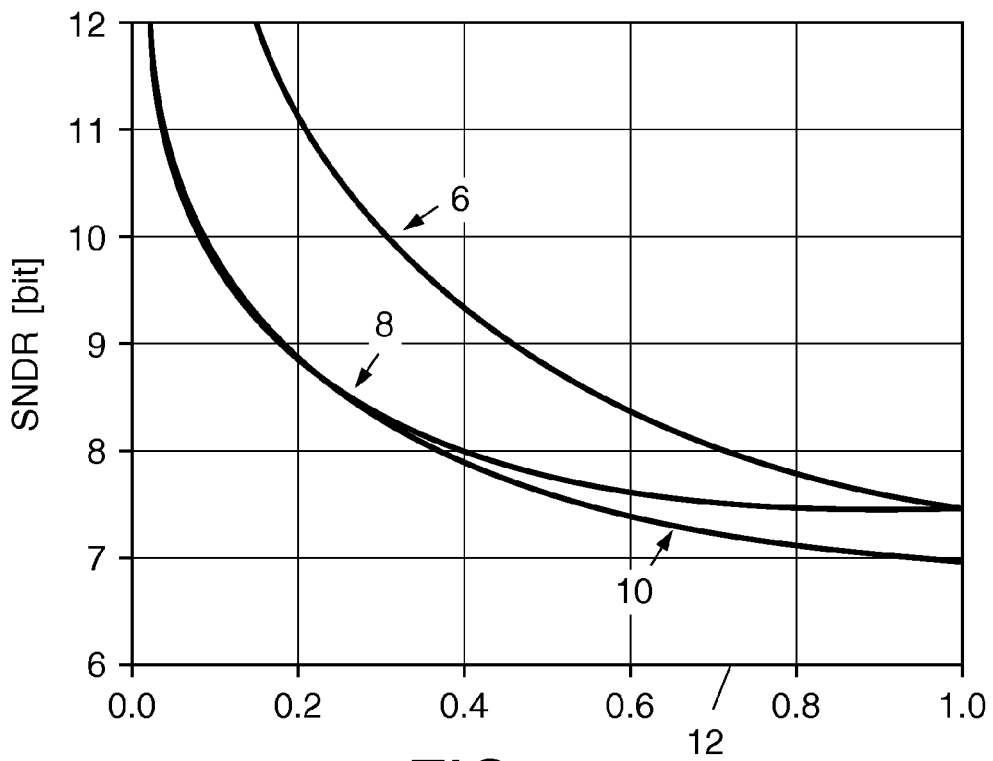
Figure 10:
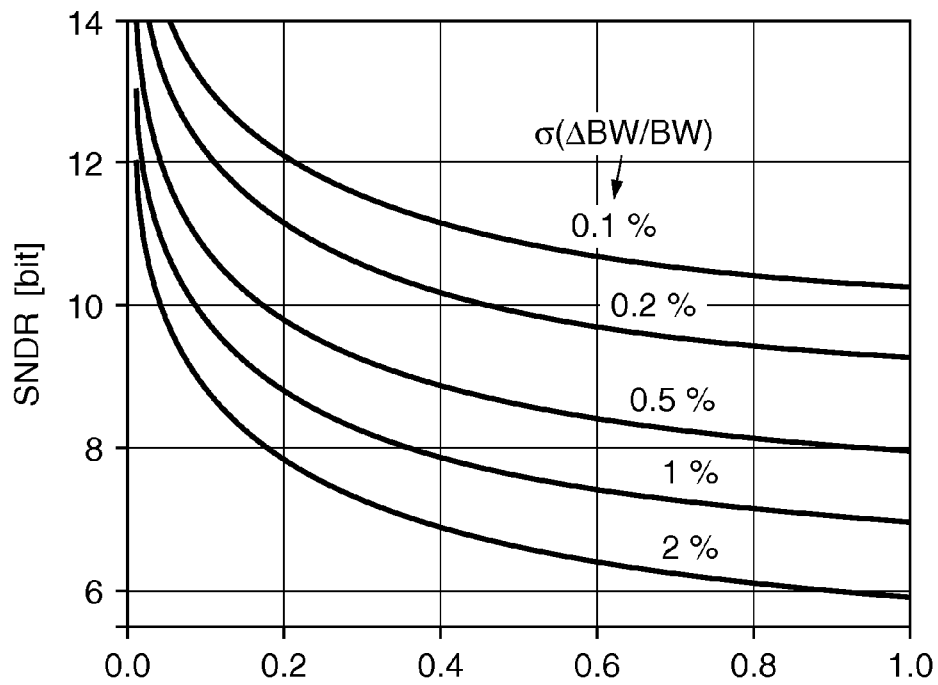
Figure 11:
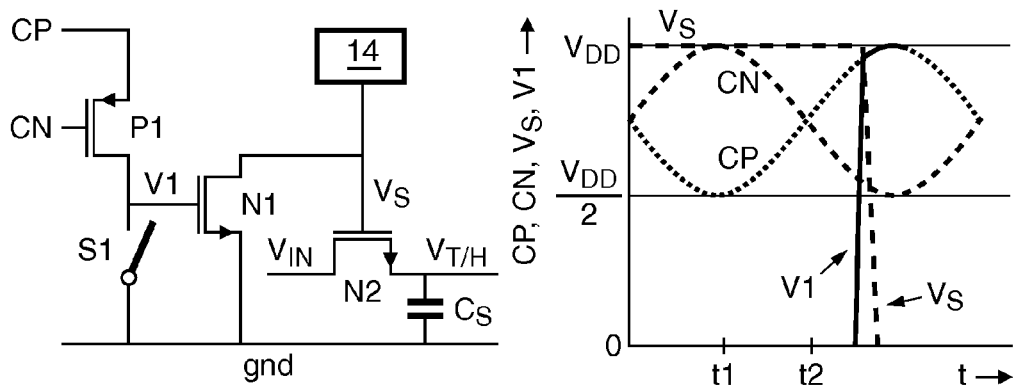
Figure 12:
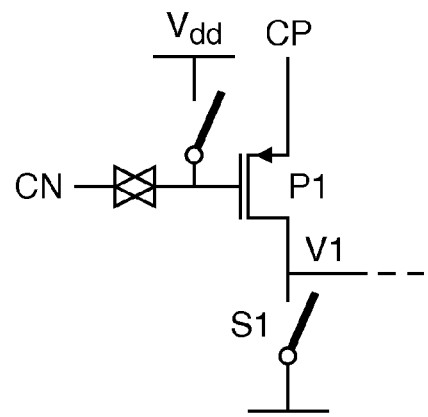
Figure 13:
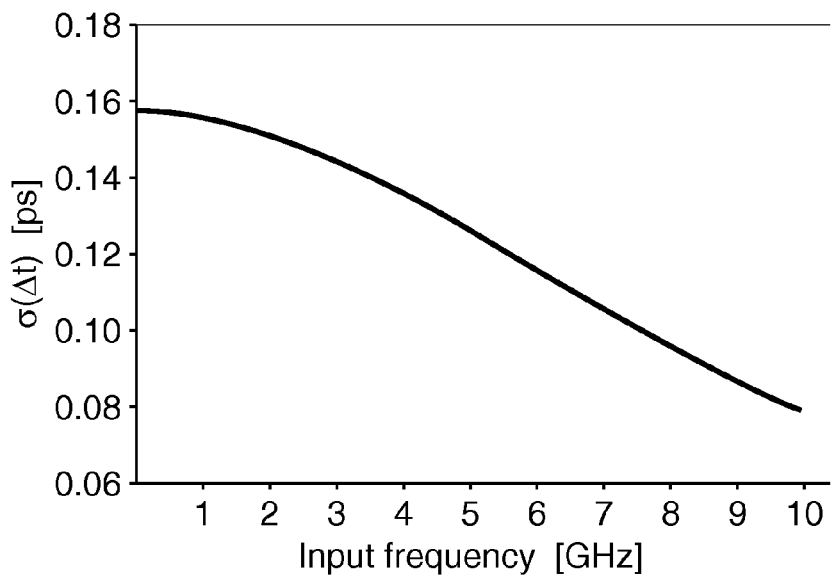
Figure 14:
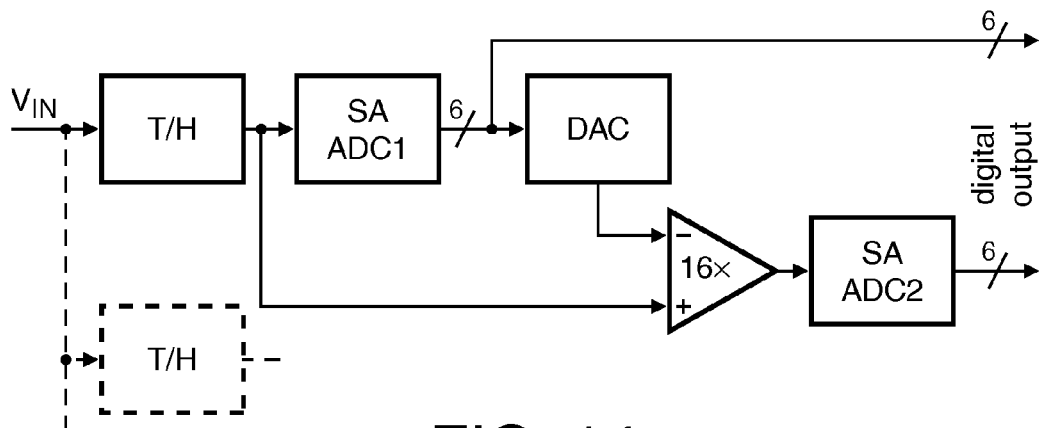
Figure 18:
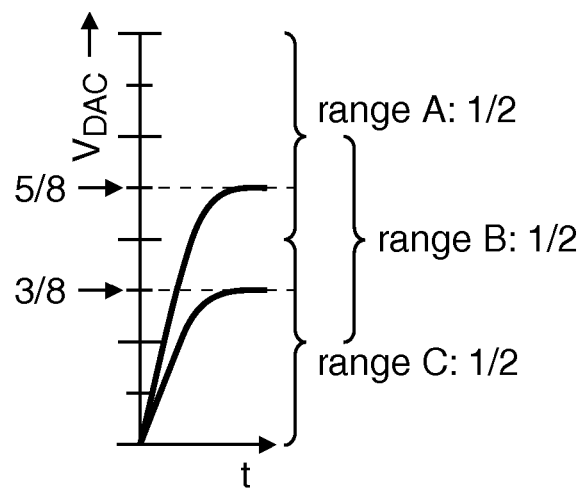
Figure 19:
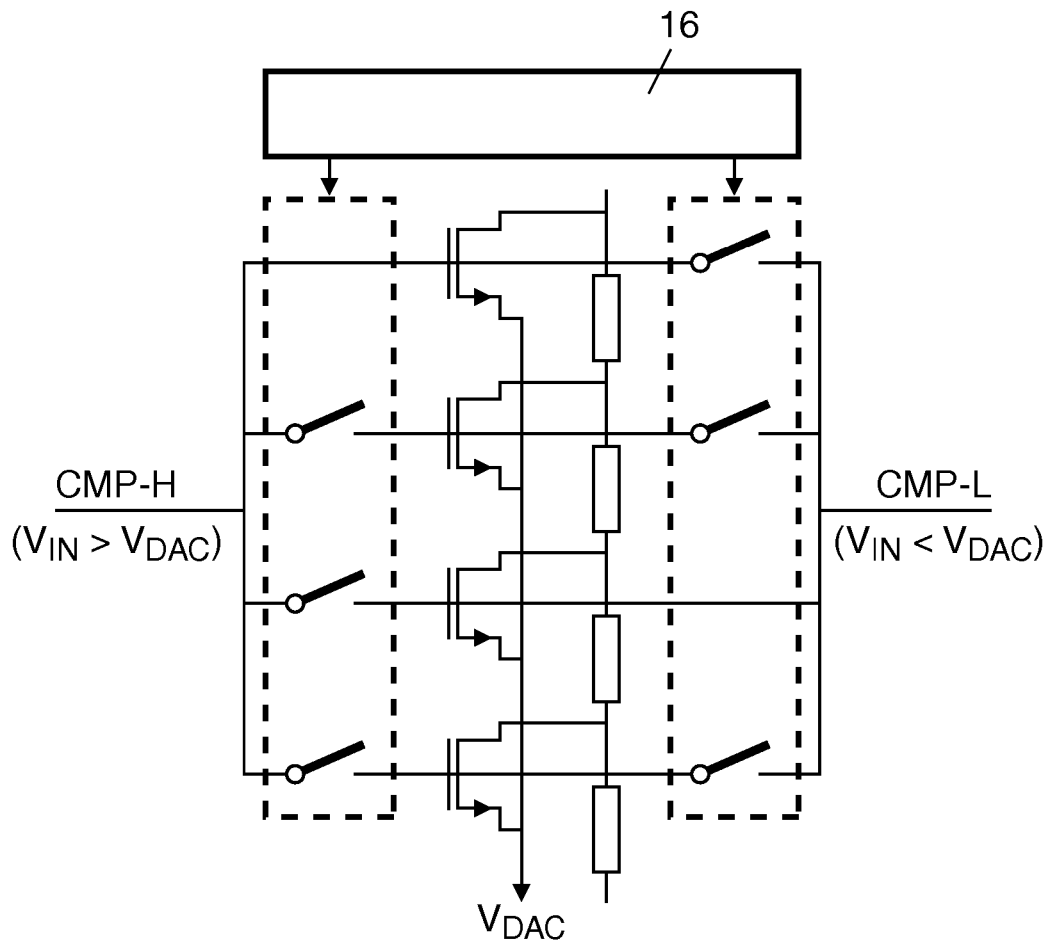
Figure 20:
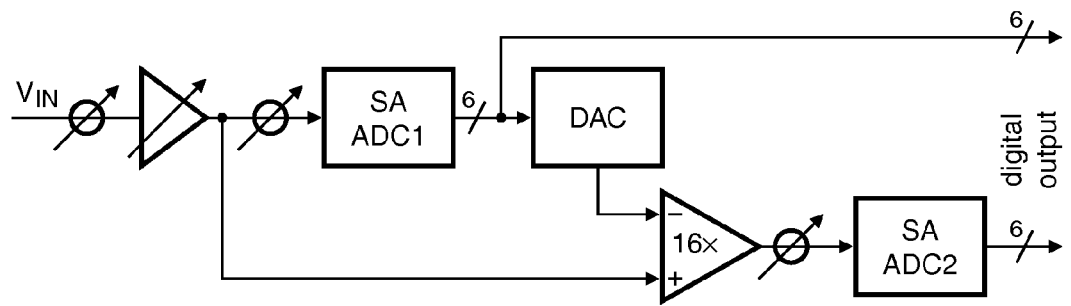
Figure 21:
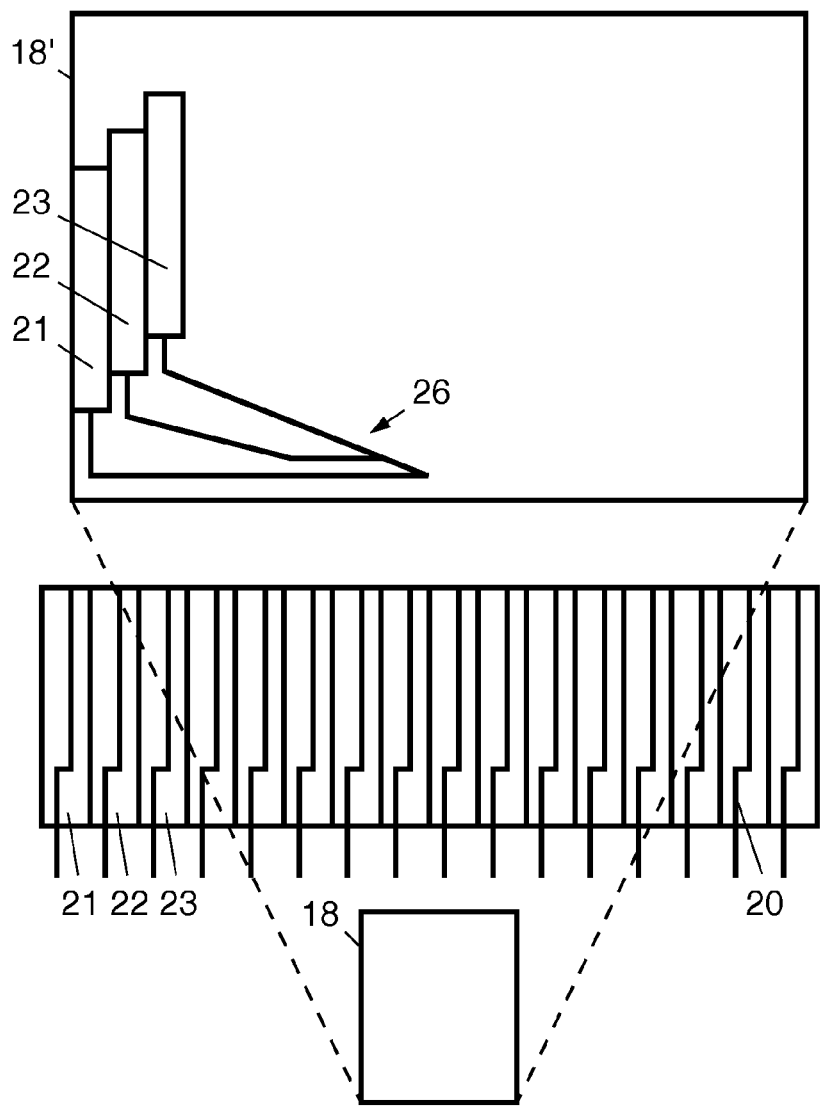
Figure 22:
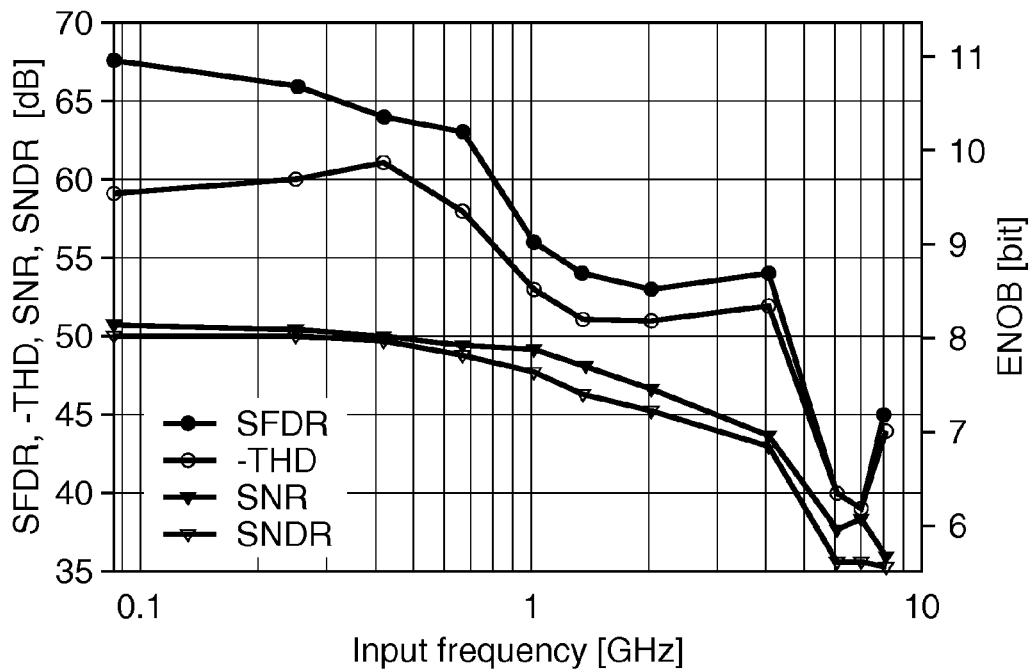
Figure 23:
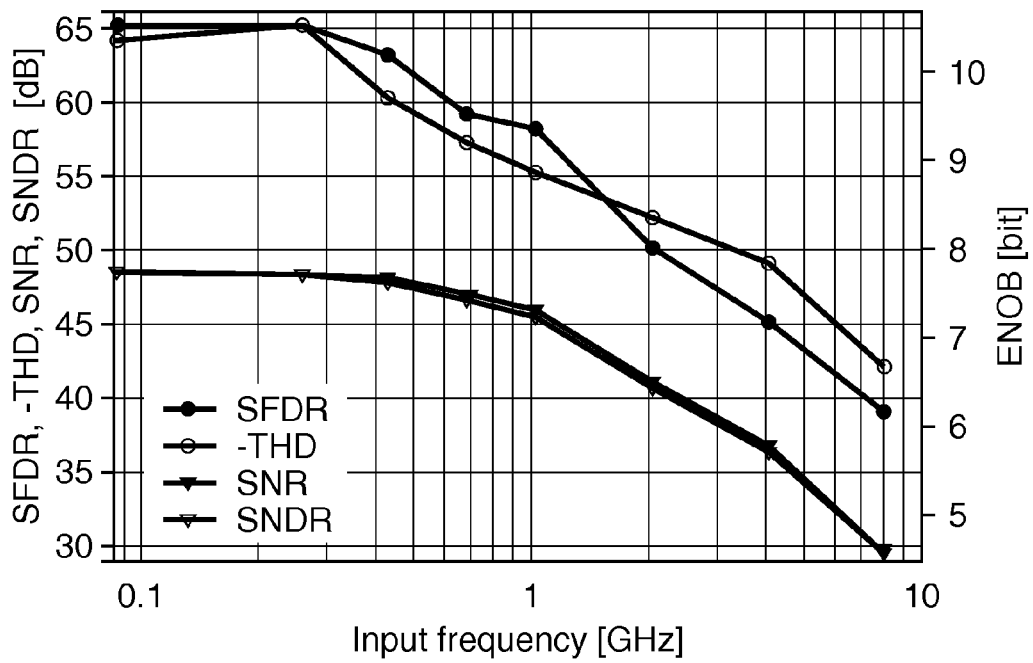
Figure 24:
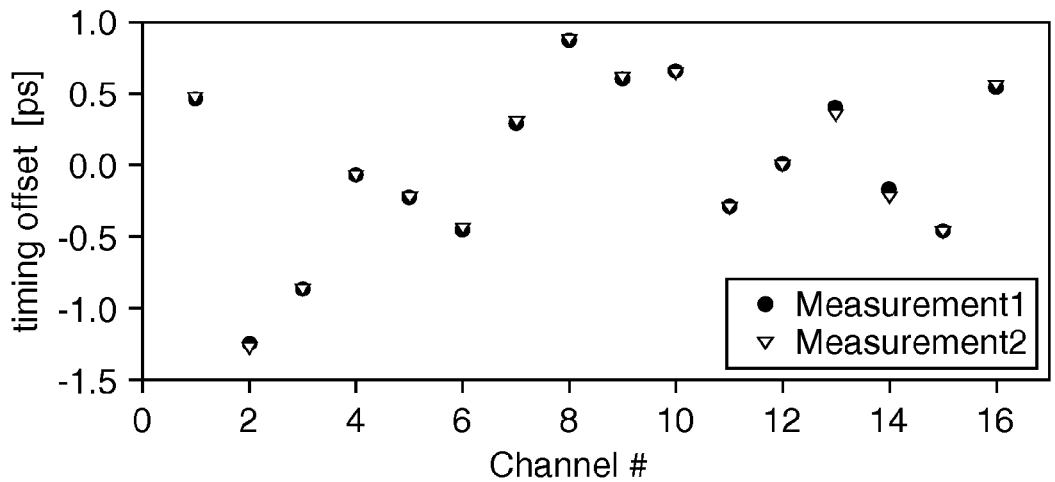
Figure 25:
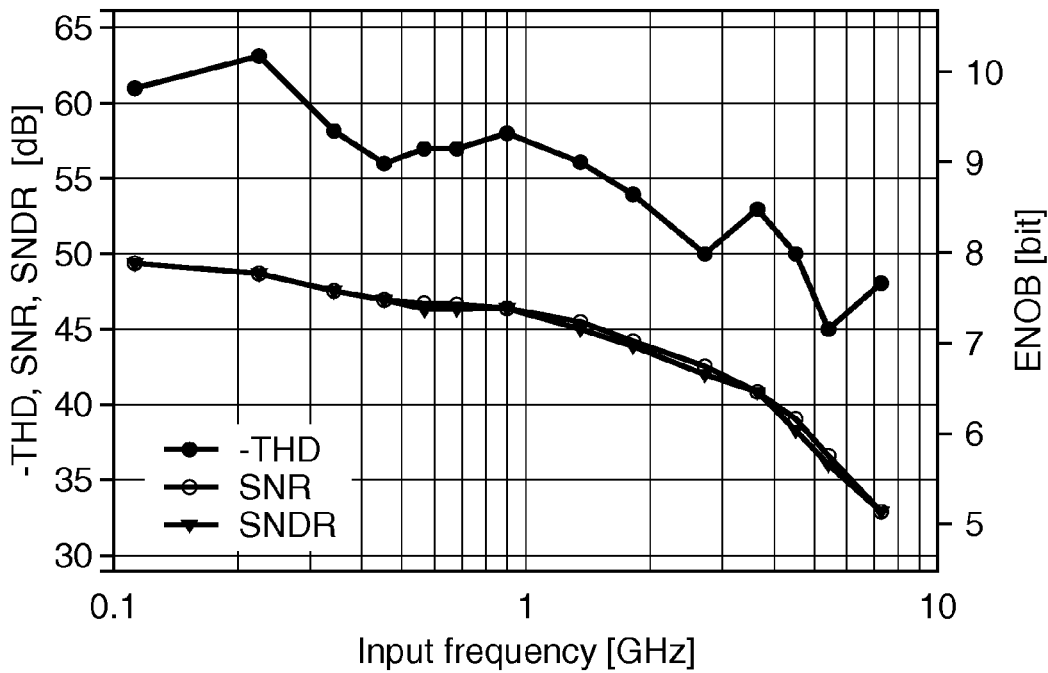

FIG. 5 schematically shows the basic schematic of one of 16 T&H channels;

FIG. 6 schematically shows a unity-gain T&H buffer (high-linearity input buffer) of FIG. 5;

FIG. 7 schematically shows sampling a high speed input signal with limited buffer bandwidth;

FIG. 8 schematically shows sampling a high speed input signal with enhanced buffer bandwidth;

FIG. 9 schematically shows a simulation result of a time-interleaved T&H;

FIG. 10 schematically shows the SNDR due to bandwidth mismatch as a function of the normalized input frequency for different values of σ(ΔBW/BW);

FIG. 11 schematically shows a CML to SE conversion circuit, together with waveforms;

FIG. 12 schematically shows a circuit extension enabling a multi-phase clocking scheme;

FIG. 13 schematically shows the standard deviation of the timing error due to bandwidth mismatch as a function of the input signal frequency for a nominal bandwidth of 10 GHz and a σ(ΔBW/BW) of 1%;

FIG. 14 schematically shows an overview of the sub-ADC architecture (1/16 of the total ADC);

FIG. 15 schematically shows addition of the two ADC values;

FIG. 16 schematically shows conventional overrange techniques;

FIG. 17 schematically shows single-sided overrange techniques;

FIG. 18 schematically shows architecture with two comparators and two DACs;

FIG. 19 is a schematic showing the look ahead logic;

FIG. 20 schematically shows an overview of all calibrations in a channel;

FIG. 21 is a block diagram showing certain features derived from a photograph of a chip in which the 16 times interleaved T&H and 16 connected ADCs are fabricated in 0.13 μm CMOS;

FIG. 22 schematically shows a measurement result at a total sample-rate of 1350 MS/s resulting in 1350/16≈84.4 MS/s for a single channel;

FIG. 23 schematically shows a 16-channel interleaved performance at 1350 MS/s, i.e. the measurement result of the complete time-interleaved ADC at 1.35 GS/s;

FIG. 24 schematically shows the extracted timing offset (normalized), i.e. the result of the operation for two measurements; and FIG. 25 shows an all-channel measurement result of a further improved design.

In the following:

Section I provides an introduction;

Section II gives a description of a time-interleaved track-and-hold sampling circuit;

Section III discusses the matching between the different track-and-hold channels of the time-interleaved track-and-hold sampling circuit;

Section IV describes the architecture of the ADC;

Section V discusses calibration aspects of the sampling circuit;

Section VI provides measurement results;

Section VII gives an improved design for the ADC;

Section VIII gives a conclusion; and

Section IX provides a list of references referred to in the earlier sections.

Section I—Introduction

Figure 1:
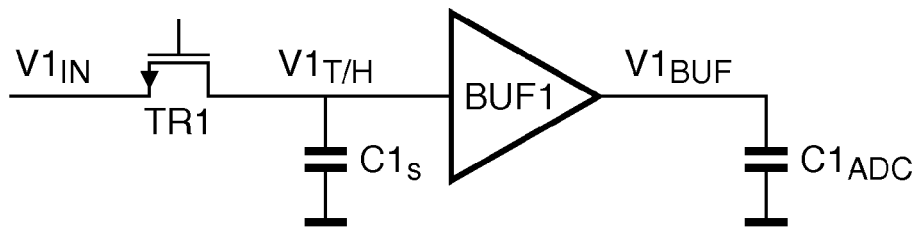
FIG. 1 is a schematic illustration of a time-interleaved ADC architecture.
Figure 3:
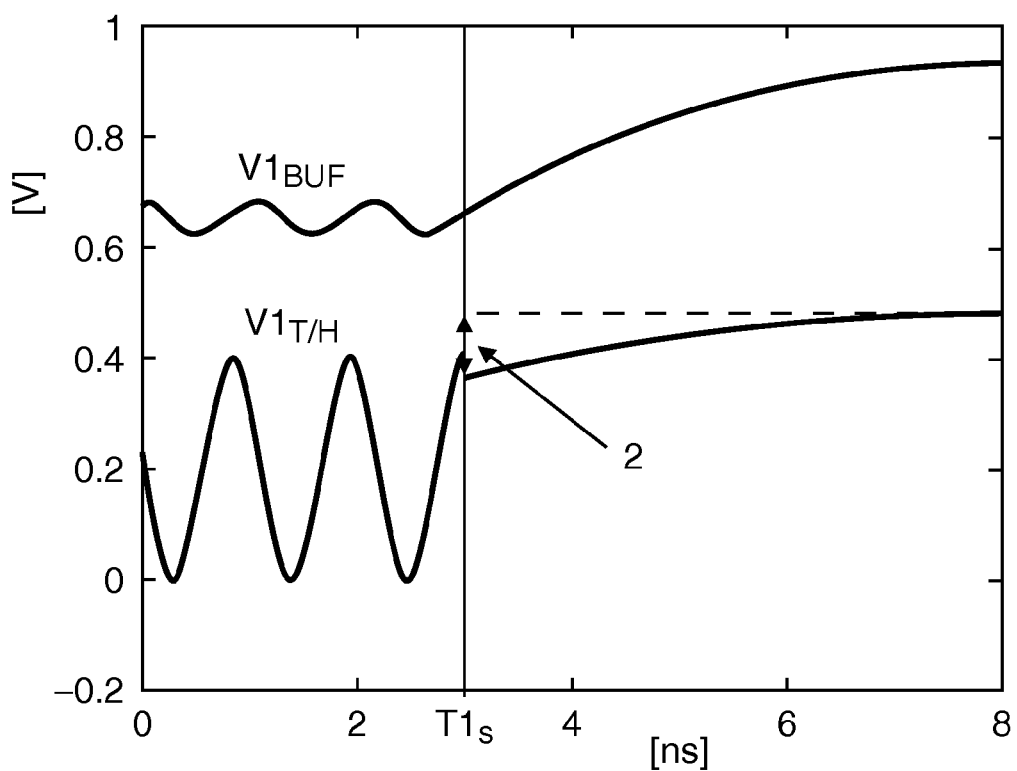
FIG. 3 is a schematic illustration relating to if the bandwidth of buffer circuits is reduced by a factor of 16.
Figure 2:
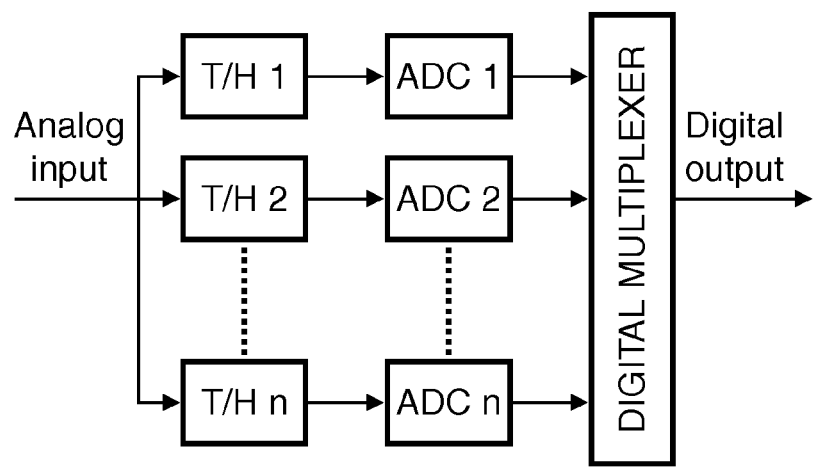
FIG. 2 is a schematic illustration of a technique for sampling high-frequency signals.

A trend in receiver design for digital TV, satellite receivers and set-top boxes is the move towards software defined radios, where the embedded Analog-to-Digital Converter (ADC) is moved closer to the antenna. Such ADCs require 8-10 bits of resolution for GHz range signals and limited power consumption of a few hundred milliwatts to be able to embed the ADC together with the digital baseband processing in a single IC. The time-interleaved ADC architecture shown in FIG. 1 offers the combination of good power efficiency with high speed. Key aspects are high-speed sampling, excellent matching between channels and power efficiency of the complete system.

Section II—Sampling Circuit (Time-Interleaved Track and Hold)

A time-interleaved track-and-hold (T&H) needs a signal bandwidth per channel far beyond the sample-rate of an individual channel. Moreover, it requires matching between channels. The T&H presented here has improved bandwidth, linearity and channel matching. Innovations presented are: an improved buffer design, a bandwidth enhancement technique and a low skew clock-driver and includes gain and offset calibration.

A. Number of Channels

By time-interleaving multiple ADCs the operation speed is increased by the interleaving factor. A trade-off exists between this factor and the input capacitance. When the interleaving factor is too high, this capacitance is also too high and a power hungry buffer is required to drive the capacitance with sufficient bandwidth and linearity. We use a moderate interleaving factor of 16 so the load can be driven by a 50Ω source and no buffer is required. For our specifications, this interleaving factor requires sub-ADCs with a sample-rate of about 100 MS/s and about 50 dB SNDR. This speed/resolution combination allows implementation with a good power-efficiency.

Figure 4:
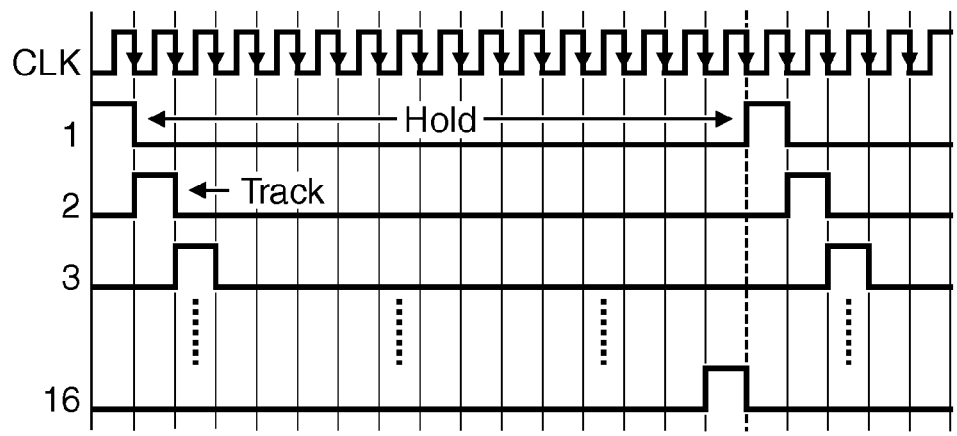
FIG. 4 is a timing diagram of a time-interleaved T&H.

The timing diagram of the time-interleaved T&H is shown in FIG. 4. At each falling edge of the master-clock (CLK), one of the T&H channels goes from track-mode to hold-mode, effectively taking a sample of the input signal. In most conventional T&Hs, the track-time is equal to the hold-time. In this design we use only one clock-cycle of the master clock for tracking. This is sufficient and has two advantages: (1) more time is available for the ADCs to perform its conversion and (2) the input capacitance is reduced because now only 1 instead of 8 sample capacitors is connected to the input simultaneously.

The basic schematic of one of the 16 T&H channels is shown in FIG. 5. The circuit is (pseudo) differential, but only a single-ended version is shown. The sample switch is bootstrapped by connecting a capacitor charged to Vdd between the source and gate of the sample switch. Bootstrapping makes the on-resistance of the sample-switch more constant over varying VIN and avoids signal dependent charge injection, resulting in better linearity. Also, the turn-off time is less dependent on the momentary voltage of the input signal.

B. Linear Buffer

The schematic of the unity-gain T&H buffer (high-linearity input buffer) of FIG. 5 is shown in FIG. 6. It is in fact a P-type source-follower, with an additional N-type source-follower aiming to keep the drain-source voltage of the PMOS transistor constant. In modern sub-micron processes the output resistance of minimum length MOSFETs has become very small and is non-linear, the first resulting in less gain and the latter resulting in distortion. By adding the second source-follower, the effective output resistance is increased and gain and linearity are improved. Compared to a conventional source-follower, the input capacitance is not increased like in a cascoded source follower, but on the contrary it is decreased: The gate-drain (overlap) capacitance is effectively lowered since the drain terminal has roughly the same phase and amplitude as the gate terminal and the small-signal current through the capacitor is mitigated. A low and linear input capacitance is important to avoid distortion of high-frequency input signals.

C. High-Bandwidth Sampling Technique

For a stand-alone T&H and a buffer with first order settling behaviour, the bandwidth requirement for the buffer for settling is:

$$BW > \frac{(n+1) \cdot \ln(2) \cdot 2 \cdot f_s}{2\pi}$$

wherein n is the resolution of the ADC (and the base-2 logarithm of the dynamic range of the T/H output signal), and assuming half the sample-period for settling. For n=10, the BW>4.9 $f_{Nyquist}$. An input buffer with this bandwidth even tracks input signals at the Nyquist frequency closely. For time-interleaved T&Hs however, the bandwidth requirement for settling is relaxed by the interleaving factor: the time allowed for settling is long compared to the maximum input signal period. The bandwidth requirement for a time-interleaved T&H is:

$$BW_{INT} > \frac{(n+1) \cdot \ln(2) \cdot 2f_s}{2\pi \cdot ifac}$$

wherein ifac is the interleaving factor, and again assuming half the sample-period for settling. With n=10 and an interleaving factor of 16, the bandwidth requirement is: BW>0.3 $f_{Nyquist}$. When a buffer with minimal bandwidth for settling is used to save power, the buffer output no longer tracks input signals at the Nyquist frequency, but a large attenuation and phase-shift is present. Now the problem as shown in FIG. 7 (FIG. 7 shows sampling a high speed input signal with limited buffer bandwidth; in FIG. 7 reference numeral 2 indicates error due to charge-redistribution) arises: During tracking, the buffer output VBUF cannot follow the input signal VT&H and at the sample moment (tSAMPLE), output signal VBUF is not yet fully settled. After the sample moment, the buffer output VBUF will slowly settle to its final value. During this settling, charge-redistribution between (1) the non-linear parasitic capacitance between the input and output of the buffer and (2) the sample capacitor causes distortion in the voltage on the sample capacitor VT&H. The buffer output VBUF therefore becomes distorted as well.

To avoid distortion, the buffer bandwidth could be increased, but this would increase the power consumption significantly. Instead, we introduce a switch between the buffer output and the ADC following the T&H as shown in FIG. 5. In track-mode this switch is open and the load capacitance of the buffer is now small. Hence the buffer bandwidth is increased and output VBUF can now follow the input VT&H as shown in FIG. 8 (FIG. 8 shows sampling a high speed input signal with enhanced buffer bandwidth; in FIG. 8 reference numeral 4 indicates the old ADC value). In this case no distortion due to charge redistribution occurs.

The addition of the switch is a very power-efficient way of coping with the high-input frequencies of a time-interleaved T&H and exploits the increased available settling time by virtue of interleaving. An additional advantage of the increased bandwidth during tracking is that the non-linear input capacitance of the buffer is reduced, making the tracking process more linear.

When the ADC is connected at t=tSWITCH, the buffer output will first make a step to the previously sampled value which is still present on the ADC input capacitance, after which the buffer will charge the ADC load to the newly sampled value, see FIG. 8. Charge redistribution after t=tSWITCH also causes a signal dependent step in VT&H, marked by S. This seems to cause distortion, however as VBUF settles to its final value, the process of charge redistribution is reversed and VT&H returns to its initial, undistorted value. The process of connecting the ADC does therefore not introduce distortion.

Section III—Matching Between Different T&H Channels

In a time-interleaved T&H differences between channels should be sufficiently small: offsets between channels cause tones at multiples of fS/N, while differences in gain, bandwidth or timing result in tones at multiples of fS/N±fIN, where N is the interleaving factor.

Reducing channel offsets by straightforward device sizing to reach the required accuracy conflicts with speed and power constraints, therefore channel offsets are made adjustable in this design. Channel gain is adjustable as well to correct for errors stemming from mismatch in the T&H buffers and the sample process. The implementation is discussed in section V below.

A. Bandwidth Matching

Bandwidth mismatch between channels causes frequency dependent differences in gain and phase. To show these effects on the SNDR, a simulation result of a time-interleaved T&H is shown in FIG. 9, when taking into account: (a) only gain errors due to bandwidth mismatch, (b) only phase errors due to bandwidth mismatch and (c) both errors. FIG. 9 shows SNDR as a function of the normalized signal frequency for $\sigma(\Delta BW/BW)=1\%$, when taking into account: (a) only gain errors due to bandwidth mismatch, (b) only phase errors due to bandwidth mismatch and (c) both errors. In FIG. 9, reference numeral 6 indicates only gain error due to BW mismatch, reference numeral 8 indicates only phase error due to BW mismatch, and reference numeral 10 indicates both errors due to BW mismatch. On the horizontal axis (indicated by reference numeral 12) the normalized signal frequency $f_{IN}/f_0$ is shown, where $f_0$ is the average channel bandwidth. For this simulation the number of channels is 16 and $\sigma(\Delta BW/BW)$ is 1%. From this figure it becomes clear that for signal frequencies close to the channel bandwidth $f_0$ both errors have an equal effect, while towards lower frequencies the effect of gain error decreases rapidly (increasing SNDR), but the effect of phase errors only decreases slowly, so phase errors are dominant for lower input frequencies.

In FIG. 10, the SNDR due to bandwidth mismatch as a function of the normalized input frequency $f_{IN}/f_0$ (where normalized input frequency $f_{IN}/f_0$ is the x-axis as indicated by reference numeral 12 in FIG. 10) is shown for different values of $\sigma(\Delta BW/BW)$. When the channel bandwidth is equal to the Nyquist frequency (fS/2), $\sigma$(gain) should not exceed 0.1% for an SNDR of 10 bits and input frequencies up to fS/2.

We will now check whether this is feasible, therefore we need to take a few assumptions. A sample-capacitor of 150 fF is sufficient to limit kT/C noise below 10 bit level. When a bandwidth of 1 GHz is required, the switch resistance RON should be 1 kΩ. A minimum length N-type MOS-switch with a width of 1 μm is just sufficient in the 0.13 μm process. The standard-deviation of the resistance mismatch $\sigma(\Delta RON/RON)$ is 3.5%, while capacitor matching is much better. $\sigma(\Delta BW/BW)$ is therefore 3.5% as well, which is much larger than the required 0.1%. Improving resistance matching by device scaling is impractical, because $\sigma(\Delta RON/RON)$ only scales with W1.

However, when the width of the switch is increased, the bandwidth is increased as well and the mismatch effects at the signal frequency become lower. When e.g. $\sigma(\Delta BW/BW)$ is 1% and the bandwidth is chosen 10 times larger than the highest signal frequency, an SNDR of almost 10 bits is possible when only considering bandwidth mismatch. For this reason, the channel bandwidth has to be chosen larger than what is required when just looking at signal attenuation.

B. Timing Matching

Calibration of timing mismatch requires high-frequency test-signals and complicated calibration algorithms. By careful design we aim for a timing alignment within the required accuracy. For a large number of channels, timing offsets between channels can be approximated as a Gaussian distribution. In this case the SNR caused by timing offsets is:

$$SNR_{\Delta t} = \frac{1}{\sigma(\Delta t) \cdot 2\pi \cdot f_{IN}}$$

For an SNR of 50 dB and an fIN of 1 GHz, the required timing offset between channels should be smaller than 0.5 ps RMS. To minimize timing offsets the following techniques are used in this design:

a master clock, such that the actual sample moment only depends on one common clock;

matched lines (indicated by reference numeral 26 in FIG. 21, which is discussed in more detail later below) to distribute clock and input signals to the channels;

minimized skew of the conversion between the common master-clock and the sample-switch using a new circuit-technique.

In applications where supply-noise may degrade performance, current mode logic (CML) is commonly used because it generates little supply noise. CML uses differential signalling, with signal swings of about half the supply voltage in our design. To convert the CML master clock into a full-swing signal suitable for the sample-switch, a conversion circuit is needed. With a conventional solution on a previous chip we measured a timing misalignment of 6 ps RMS, which is much too high for the target specification. Therefore, a new circuit topology is used as shown in FIG. 11, which shows a CML to SE conversion circuit, together with waveforms. In FIG. 11, reference numeral 14 indicates a bootstrap circuit. To minimize skew and jitter, the path from the common master-clock to the different sample switches is made as short as possible.

The operation is as follows: The T&H is put in track-mode by the bootstrap circuit, which makes the VGS of N2 equal to about VDD. At the end of the track-mode (t=t2), node VS is left floating by the bootstrap circuit and for further bootstrapping we rely on parasitic capacitances. Now, to switch into hold-mode, node VS has to be discharged to ground rapidly: transistors P1 and N1 take care of this. Assume switch S1 is closed and VCP<VCN, so node V1 is at ground potential and P1 is non-conducting. In this state switch S1 is opened, without influencing the potential of V1. When the differential voltage of the master clock (CP−CN) becomes larger than the threshold voltage VT of P1, P1 will start to conduct and node V1 will be charged to VCP as shown in FIG. 11. This will make N1 conducting, discharging node VS rapidly and putting the circuit into hold-mode. This is the only time-critical event in the T&H.

In a time-interleaved T&H, the different channels should sample one after the other, with a delay of one clock-period, see FIG. 4. At the falling edge of the master-clock, only one of the channels should switch into hold-mode. The circuit of FIG. 11 can be extended with a transmission-gate (TM-gate) and a pull-up switch as shown in FIG. 12. FIG. 12 shows a circuit extension enabling a multi-phase clocking scheme. When the T&H should not switch into hold-mode, the TM-gate is made non-conducting and the gate-node of P1 is pulled to VDD. In this case P1 never starts conducting and node V1 stays at ground. When the circuit should switch into hold-mode, the TM-gate is made conducting when VCP<VCN (e.g. when t=t1) and the pull-up switch is made inactive. In this case the behavior is the same as without the TM-gate and the T&H switches into hold-mode when VCP−VCN>VT.

Advantages of this Solution

Only the mismatch of P1 and N1 influences the skew, so the complete "spread budget" can be spent in these transistors.

Only the difference between the differential clocks CP and CN determines the sample moment; the common-mode signal is rejected.

Both differential clocks are used and the effective slope is doubled, which halves the influence of the threshold voltage variations of P1.

By minimizing the number of transistors between the clock-input of the chip and the sample-switch, jitter is minimized as well.

By cascading P1 and N1, which are otherwise not connected (no current sources), the gain is maximized. This results in a very steep slope at VS and makes the sample process closer to ideal.

The expected timing-misalignment is 0.45 ps RMS. This value is derived from multiplying the (simulated) switching-slopes by the $\sigma(\Delta VT)$ of the respective transistors.

C. Bandwidth Mismatch Induced Timing Errors

Both timing-misalignment and bandwidth mismatch result in per-channel time-shifted versions of the input-signal. We will now compare the bandwidth mismatch induced time-shift to the timing-misalignment of the sampling. FIG. 13 shows the standard deviation of the timing error due to bandwidth mismatch as a function of the input signal frequency for a nominal bandwidth of 10 GHz and a $\sigma(\Delta BW/BW)$ of 1%. With increasing input signal frequency, the differences in phase increase slowly (up to the nominal bandwidth), while the signal period decreases linear with the frequency, resulting in a slightly decreasing time-error with increasing signal frequency. Note that the absolute error increases with frequency, because this error is equal to the time error multiplied by the derivate of the input signal.

Compared to the expected timing-misalignment of 0.45 ps RMS, the contribution of the bandwidth mismatch induced timing-error is small and will not degrade timing performance significantly.

Section IV—Sub-ADC Architecture

The 16 sub-ADCs in this design require a sample-rate of about 100 MS/s and we aim for an SNDR of 50-55 dB. To reduce quantization noise sufficiently such that it does not limit SNDR, we chose a resolution of 10 bits. In a thermal-noise limited design, an additional bit does not increase the power consumption significantly. For these specifications various architectures exist, such as pipeline and two-step converters. The Successive Approximation (SA) ADC architecture is chosen here for its high power efficiency; it uses only 1 comparator and high-gain amplifiers—a necessity in pipeline and two-step architectures—are not required, which makes it suitable for nanometer scale technologies. Its operation speed is however limited at high resolution: for an n bit converter, n iterations are required. In order to exploit the advantages of an SA-ADC in this design, three techniques are used to get a high sample-rate and good power efficiency: (A) two SA-ADCs are combined in a pipeline configuration (B) single-sided overrange technique and (C) look-ahead logic.

A. Pipelining

An overview of the sub-ADC architecture which is used 16 times in the complete ADC is shown in FIG. 14, i.e. FIG. 14 shows an overview of the sub-ADC architecture (1/16 of the total ADC). It consists of an interleaved T&H section, a first 6 bit SA-ADC, a DAC, an inter-stage amplifier and a second 6 bit SA-ADC. All signalling is pseudo differential. The amplifier has an implicit T&H, such that both SA-ADCs have a full period to do their conversion. Compared to a single 10 bit SA-ADC their requirements are relaxed: fewer steps are needed and thus more time is available per step and the required accuracy is reduced.

The gain of the amplifier is 16, such that the bits of the second ADC have to be shifted 2 log(16)=4 positions to the right in order to get the same weights from both ADCs. The overall resolution is 10 bit and the overrange is 4 LSBs of the first ADC, see FIG. 15 (FIG. 15 shows addition of the two ADC values). This large overrange has two advantages: Firstly, the requirements on the first ADC are relaxed and secondly, the requirements on the inter-stage amplifier are significantly reduced, because after amplification by 16 the residue signal is nominally only a quarter of the range.

The inter-stage amplifier uses a switched-capacitor opamp configuration with offset cancellation of the two-stage opamp. To stabilize the common-mode signal, switched-capacitor common-mode feedback is applied. The DAC is implemented as a resistor-ladder with switches. This has the advantage that the DAC can be shared between channels, lowering the ladder impedance per channel and thus allowing reduced ladder current, which saves power. Moreover, mismatch between DACs of different channels is avoided.

B. Single-Sided Overrange Technique

An SA-ADC operates in a loop: The comparator makes a decision, the control logic determines the next DAC level and the DAC settles to the next value. For an n bit converter n iterations are required. All three actions have to be completed within one clock-cycle. A technique to reduce the delay caused by the DAC settling is discussed next, followed by a technique to reduce the delay of the logic.

For a conventional SA-ADC the DAC settling error should be smaller than ½ LSB. For an RC limited DAC, the time required for settling is: tSETTLE>ln($2^n$)·τ, where n is the number of bits and τ is the settling time constant of the DAC. For a 6 bit converter, 4.2 τ of DAC settling is required in the first clock cycle, while in the later steps less time is required due to the smaller step size. It is unpractical to have different settling times for different steps, therefore we assume the worst-case settling time in all steps.

The settling time can be reduced by employing the principle of overranging. When an overrange of ⅛ of the range is used as shown in FIG. 16 (FIG. 16 shows conventional overrange techniques), the DAC settling can be reduced to only 1.4 τ. The next range has the size of ⅝ of the previous range (the radix is ⅝) and 2 log(⅝)=0.68 bit is resolved each cycle, requiring 9 cycles to reach 6 bits of accuracy.

The overrange technique assumes overrange on both sides of the comparison level. An RC limited DAC however, does not show overshoot during transients and the DAC error is only due to incomplete settling. An overrange is therefore only needed at the side from which the DAC is settling. This is schematically shown in FIG. 17 (FIG. 17 shows single-sided overrange techniques) for a rising DAC signal (for a falling DAC signal the diagram is vertically flipped). The DAC settling requirement is the same as in the case of normal overranging: 1.4 τ. The size of the next range is now 9/16 of the previous range, resulting in 0.83 resolved bits per cycle and only 7 instead of 9 cycles are required for 6 bits of accuracy. Note that the DAC signal is no longer settling to the middle of the range, but instead to 9/16 of the range, in order to give both new ranges (A and B) the same size.

For comparison, the diagram of an alternative architecture is shown in FIG. 18 (FIG. 18 shows architecture with two comparators and two DACs), where 2 comparators are used to select one out of three ranges. In this case 1.4 τ of settling is also required. The radix is 2, so 6 steps are needed for 6 bits of accuracy. This architecture is commonly used in 1.5 bit/stage pipeline converters.

TABLE 1

Architecture comparison

| Architecture | # steps | settling time | total time | power | FoM = P · time |
|---|---|---|---|---|---|
| conventional | 6 | 4.2 τ | 25.2 τ | 6 | 151 |
| ⅛ overrange | 9 | 1.4 τ | 12.6 τ | 9 | 113 |
| single-sided overrange | 7 | 1.4 τ | 9.8 τ | 7 | 69 |
| 2 CMPs | 6 | 1.4 τ | 8.6 τ | 2 · 6 | 101 |

In Table 1 above an overview of the architectures is given. For each architecture the following information is shown: (1) the number of steps, (2) the required DAC settling time per step, (3) the total settling time and (4) a number representing power consumption, which is two times the number of steps for the two-comparators case, because it needs two comparators and two DACs. The last column (5) shows a Figure of Merit (FoM) for comparing the power efficiency of the various architectures. It is comparable to the FoM of an ADC: Power divided by the sample-rate (1/time). The accuracy is not included in this FoM, because it is the same for all architectures.

From the table it becomes clear that the architecture with two comparators has the shortest settling time and the single-sided overrange architecture is second best on this criterion, but that the latter has a better power-efficiency. Compared to the normal overrange architecture commonly used in SA-ADCs, the power efficiency of the single-sided overrange architecture is better by 40%.

C. Look-Ahead Logic

To reduce the delay of the logic, the following technique is used: After each comparator decision there are two possible DAC levels, which are calculated in advance. Once the decision is known, the correct level only has to be picked.

This is implemented with the schematic of FIG. 19 (FIG. 19 is a schematic showing the look ahead logic), consisting of a resistor-ladder DAC and two banks of switches which are controlled by the look-ahead logic, the look-ahead logic being indicated in FIG. 19 by reference numeral 16. Before the comparator makes a decision, one switch in each bank is made conducting and both comparator outputs (CMP-H and CMP-L) are now connected to the appropriate switches in the DAC. Both comparator outputs are initially zero and the DAC output is floating. When the comparator now makes its decision, only one of the outputs becomes active high, the DAC switch is activated and the DAC starts to settle immediately. Any logic gate-delay is avoided.

Section V—Calibrations

Time-interleaved ADCs often require calibration of gain and offset and sometimes of timing. Here, calibration of channel gain and offset is used to correct for deviations caused by the use of small T&H buffers. This way no part of the input window is sacrificed and high-speed power-hungry digital operations are avoided.

To enable the use of small differential pairs to keep the load for the DAC small and thus save power, comparator offset is also made adjustable. All adjustments are controlled digitally by modifying analog bias settings in the input buffer via 6 and 7 bits DACs. In this test-chip the digital bias settings are controlled manually.

An overview of all calibrations in a channel is shown in FIG. 20. The calibration could be automated in a start-up calibration as follows: It is started by shorting the inputs of all comparators by built-in switches and minimizing their offsets by looking at the output data of the ADCs. Next, the ADC input is shorted and the channel offsets are minimized. Finally, a full-scale DC input signal is applied and the channel gain can be made equal, again using the ADC outputs. All calibrations can thus be performed using only quasi-DC input signals.

The 16 times interleaved T&H and 16 connected ADCs are fabricated in 0.13 μm CMOS. FIG. 21 is a block diagram showing certain features derived from a photograph of the chip, with a zoom-in on the interleaved T&H on the right-hand side, which has an area of 0.14 mm². The total active area of T&H and ADCs is 1.6 mm². In more detail, FIG. 21 shows on the left hand side of the Figure, outlines of the following features derived from the photograph: the track and hold circuitry 18, and the sixteen ADCs (one of which is indicated in FIG. 21 by way of example by reference numeral 20). Each ADC 20 provides part of a respective channel, of which channel number 1, channel number 2, and channel number 3 (indicated respectively by reference numerals 21, 22 and 23) are highlighted in FIG. 21. FIG. 21 further shows, on the right hand side of the Figure, a zoom-out 18' of the track and hold circuitry 18. The zoom-out 18' of the track and hold circuitry 18 shows in more detail the layout of the exemplary channel numbers 1, 2 and 3 (reference numerals 21, 22 and 23). The zoom-out 18' of the track and hold circuitry 18 also shows matched lines 26 for clock, signal and power.

Section VI—Measurement Results

First, the measurement result of a single channel is discussed. During this measurement all channels are active, however only the data from one channel is analyzed. The T&H is directly connected to a 50Ω signal generator and only comparator offset is adjusted. In FIG. 22 the measurement result is shown at a total sample-rate of 1350 MS/s resulting in 1350/16≈84.4 MS/s for a single channel. At low signal frequencies the SNDR is 8.0 ENOB limited by amplifier noise and quantization imperfections. The THD for low frequencies is −60 dB. For higher signal frequencies than the Nyquist frequency per channel (>42 MHz), the ADCs are sub-sampling and performance degradation is purely due to the T&H. The THD improvement at 8 GHz is due to a decrease in signal amplitude caused by losses in the test-bench signal path. THD at 4 GHz is −52 dB and THD at 8 GHz is −44 dB, which shows the excellent bandwidth and linearity of the T&H thanks to the use of the new circuit techniques applied in the T&H and the buffer. At 4 GHz input frequency the SNDR is 6.9 ENOB and at 8 GHz the SNDR is 5.6 ENOB, which are higher than any values found in literature for any ADC at these frequencies.

When increasing the signal frequency, thermal noise and quantization noise stay constant, while noise due to jitter increases linearly with the signal frequency. At a very high signal frequency, the SNR is strongly dominated by jitter and a good (but worst-case) approximation of the RMS jitter is therefore given by: $\sigma(\Delta t)=10^{-SNR/20}/2\pi \cdot fIN$. Using this, the total jitter stemming from clock and signal generators and the circuit is only 0.2 ps RMS, which is better than any value for a T&H or ADC in CMOS found in literature.

The 16-channel interleaved performance at 1350 MS/s is shown in FIG. 23 (FIG. 23 shows the measurement result of the complete time-interleaved ADC at 1.35 GS/s). The SNDR is 7.7 ENOB at low input frequencies and the ERBW is 1 GHz. Compared to the single channel case, the performance is only slightly degraded, showing that channel gain and offset are adjusted satisfactory and the step-size of the adjustment DACs is sufficiently small.

It is possible to extract the timing-misalignment from the measured data by determining the phase of the input signal for each channel by means of an FFT. This way jitter is averaged out and only the timing offsets remain. The result of this operation for two measurements is shown in FIG. 24 (FIG. 24 shows the extracted timing offset (normalized). The extracted RMS timing misalignment is 0.6 ps RMS, which is close to the expected value of 0.45 ps RMS and which shows that the low skew technique is useful. Because of the dominance of timing-misalignment, total timing error across all channels including jitter is also 0.6 ps RMS. At 2 GHz the SNDR is 6.5 ENOB and at 4 GHz the SNDR is 5.8 ENOB, limited by timing-misalignment.

The input capacitance is about 1 pF and with a termination of 50Ω on-chip and 50Ω source impedance this results in an RC limited analog input bandwidth of 6 GHz. The T&H buffers use a supply of 1.6 V, while the rest of the circuit uses 1.2 V.

Power consumption of the T&H including clock-buffer and timing generation is 34 mW, the T&H buffers consume 40 mW and the 16 ADCs consume 100 mW. The FoM of the complete ADC calculated by power/{2ENOB·min(fS, 2·ERBW)} is 0.6 pJ per conversion-step. Note that the ERBW of 1 GHz is much larger than fS/2 and that broadband signal handling capability is demonstrated through continued graceful degradation (6 dB/octave) up to a record input frequency of 8 GHz.

Section VII—Further Improvements

In order to increase the performance of the ADC even more, two aspects could be improved: SNR and sample-rate. The SNR is mainly limited by (1) thermal noise stemming from the inter-stage amplifier and (2) excessive quantization noise of the SA-ADCs.

Noise from the inter-stage amplifier was decreased by increasing the transconductance of the input differential pair and decreasing the noise contributions from the current sources. The excessive quantization noise of the SA-ADCs is caused by crosstalk between a comparator output and one of the differential DAC outputs. When the comparator output returns to zero, parasitic capacitive coupling causes a change in the DAC voltage. The comparator and DAC lines run 100 μm in parallel and are separated by a grounded wall. The comparator output makes a full swing of nominal 1.2V and only 0.2 fF of parasitic capacitance is needed to cause an LSB error in the DAC. By increasing the distance between the wires and increasing the height of the shielding wall the parasitic capacitance asymmetry decreases only very slowly. Therefore a different approach was chosen: The differential DAC lines were given a twist in the middle. The result is that the coupling from the comparator output is now a common-mode effect, which is rejected by the pre-amplifier of the opamp.

To allow a higher sample-rate, the current of the current-mode-logic clock-generator and other blocks was increased by 30% and more care was taken to avoid speed degradation due to dummy metal fill.

A. Measurement Results of Further Improved Design

At low sample-rates the interleaved performance is now 8.6 ENOB (8.8 ENOB for a single channel) proving that the noise of the inter-stage amplifier is lowered and the quantization noise of SA-ADCs is reduced.

At a nominal supply voltage the T&Hs and SA-ADCs are functional up to 2 GS/s, however the inter-stage amplifier is only functional up to a sample-rate of 1.2 GS/s. When the bias current of the amplifier is decreased, it is functional at higher sample-rates, however in this case its limited settling degrades the SNDR. In order to make the amplifier operate with nominal bias settlings, the supply voltage has to be increased to 1.8 V, which degrades SA-ADCs performance. At a sample-rate of 1.8 GS/s, single-channel performance is 8.3 ENOB for low input frequencies, 7.4 ENOB@3.6 GHz and 5.9 ENOB@7.2 GHz.

Measurement results using all channels at 1.8 GS/s are shown in FIG. 25 (FIG. 25 shows all-channel measurement result of the further improved design). At low input frequencies the SNDR is 7.9 ENOB, limited by DAC settling and the negative effect of the high supply voltage. The ERBW is 1 GHz and the FoM is 1 pJ/C and the power consumption is 416 mW, which is almost doubled due to the increased supply voltage. Total timing error due to jitter and misalignment between channels is 0.4 ps RMS. The timing alignment is improved by 30% due to the increased edge steepness of the CML-clock.

Compared to the first design the maximum sample-rate is increased significantly and at nominal supply (and reduced sample-rate) the SNDR is increased by almost 1 ENOB. In Table 2 below, the performance summary of the earlier described design and the further improved design is shown. The further improved design shows that this architecture is scalable up to even higher sample-rates and resolutions.

TABLE 2

Performance summary

| Design | Original | Improved |
|---|---|---|
| Sample-rate | 3.5 GS/s | 1.8 GS/s |
| ENOB ($f_{IN}$ = DC) | 7.7 b (1-ch: 8.0 b) | 7.9 b (1-ch: 8.3 b) |
| ENOB ($f_{IN}$ = 4 GHz) | 5.8 b (1-ch: 6.9 b) | 6.4 b (1-ch: 7.3 b) |
| ERBW | 1.0 GHz | 1.0 GHz |
| Input bandwidth | 6 GHz ($C_{IN}$ = 1 pF) | 6 GHz ($C_{IN}$ = 1 pF) |
| Power consumption | 175 mW @ 1.2 V | 416 mW @ 1.8 V |
| $\text{FoM} = \dfrac{P}{2^{ENOS} \cdot \min(f_S, 2 \cdot \text{ERBW})}$ | 0.6 pJ/conv.step | 1 pJ/conv.step |
| Jitter | 0.2 ps RMS | 0.2 ps RMS |
| Timing misalignment | 0.6 ps RMS | 0.4 ps RMS |

Section VIII—Conclusion

A time-interleaved ADC is demonstrated with 16 channels. By using a new buffer and removing the load in track-mode, the T&H reaches a high bandwidth and good linearity. For a single channel, THD is −52 dB at an input frequency of 4 GHz and SNDR is 43 dB, which is only limited by (best-in-class) jitter of 0.2 ps RMS. With a novel circuit design a good timing alignment of 0.6 ps RMS is achieved, even without timing calibration.

By pipelining two SA-ADCs a combination of high sample-rate and good power efficiency can be reached. The single-sided overrange architecture achieves a 40% higher power efficiency compared to the conventional overrange architecture and look-ahead logic minimizes logic delay in the SA-ADC. The FoM of the complete ADC including T&H is 0.6 pJ per conversion-step. The SNDR is 7.7 ENOB for low signal frequencies, while the ERBW is 1 GHz, showing broadband signal handling capability.

An improved design achieves an SNDR of 8.6 ENOB for low sample-rates and with a higher supply voltage it reaches a sample-rate of 1.8 GS/s with 7.9 ENOB at low signal frequencies and an ERBW of 1 GHz. At fIN=3.6 GHz, the SNDR is still 6.5 ENOB and total timing error including jitter is only 0.4 ps RMS, which is better than any value found in literature for an ADC with a bandwidth larger than 1 GHz.

From reading the present disclosure, other variations and modifications will be apparent to the skilled person. Such variations and modifications may involve equivalent and other features which are already known in the art of analogue to digital conversion, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, and reference signs in the claims shall not be construed as limiting the scope of the claims.

The invention claimed is:

1. A sampling circuit for sampling a signal, the sampling circuit comprising a plurality of sampling channels adapted to sample the signal in time-multiplexed fashion, each sampling channel comprising a respective track-and-hold circuit connected to a respective analogue to digital converter via a respective output switch; the output switch of each channel adapted to:
   open for a tracking time period when the track-and-hold circuit of the sampling channel is in a tracking mode for sampling the signal; and
   close for a holding time period when the track-and-hold circuit of the sampling channel is in a holding mode for outputting the sampled signal.

2. The sampling circuit of claim 1, wherein the holding time period comprises a settling time period required for the track-and-hold circuit to charge an input capacitance of the analogue to digital converter to a voltage according to the sampled signal, and wherein the settling time period is at least as long as the tracking time period.

3. The sampling circuit of claim 1, wherein each track-and-hold circuit comprises:
   a sampling switch having an input for receiving the signal;
   a sampling capacitor that is connected to the output of the sampling switch;
   a buffer having an input that is connected to the output of the sampling switch, and an output that is connected to the output switch; and
   a control circuit, adapted to:
   close the sampling switch and open the output switch for the tracking time period;
   open the sampling switch and close the output switch for the holding time period.

4. The sampling circuit of claim 3, wherein the sampling switch is bootstrapped.

5. The sampling circuit of claim 3, wherein the buffer is a unity gain buffer.

6. The sampling circuit of claim 5, wherein the unity gain buffer is a p-type source-follower with an additional n-type source-follower.

7. The sampling circuit of claim 1, wherein the channel offset of each channel is adjustable.

8. The sampling circuit of claim 1, wherein each analogue to digital converter comprises two Successive Approximation analogue to digital converters combined in a pipeline configuration.

9. The sampling circuit of claim 1, wherein each analogue to digital converter is adapted to employ a single-sided overrange technique.

10. The sampling circuit of claim 1, wherein each analogue to digital converter is adapted to employ look-ahead logic.

11. The sampling circuit of claim 1, wherein the number of sampling channels is 16.

12. The sampling circuit of claim 1, wherein the sampling circuit comprises a master clock.

13. The sampling circuit of claim 1, wherein the sampling circuit comprises matched lines adapted to distribute clock and input signals to the channels.

14. A method of sampling a signal, the method comprising:

using a sampling circuit for sampling a signal, the sampling circuit comprising a plurality of sampling channels adapted to sample the signal in time-multiplexed fashion, each sampling channel comprising a respective track-and-hold circuit connected to a respective analogue to digital converter via a respective output switch; and, for each channel:
opening the output switch for a tracking time period when the track-and-hold circuit of the sampling channel is in a tracking mode for sampling the signal; and
closing the output switch for a holding time period when the track-and-hold circuit of the sampling channel is in a holding mode for outputting the sampled signal.

15. The sampling circuit of claim 1, wherein each analogue to digital converter comprises two Successive Approximation analogue to digital converters combined in a pipeline configuration, wherein each analogue to digital converter is adapted to employ a single-sided overrange technique, and wherein each analogue to digital converter is adapted to employ look-ahead logic.

16. The sampling circuit of claim 15, wherein the buffer is a unity gain buffer.

17. The sampling circuit of claim 16, wherein the unity gain buffer is a p-type source-follower with an additional n-type source-follower.

* * * * *